United States Patent
Potok et al.

(10) Patent No.: US 8,232,586 B2
(45) Date of Patent: Jul. 31, 2012

(54) SILICON PHOTON DETECTOR

(75) Inventors: Ronald M. Potok, Austin, TX (US); Rama R. Goruganthu, Austin, TX (US); Michael R. Bruce, Austin, TX (US)

(73) Assignee: GlobalFoundries Inc., Cayman Islands (KY)

( * ) Notice: Subject to any disclaimer, the term of this patent is extended or adjusted under 35 U.S.C. 154(b) by 434 days.

(21) Appl. No.: 12/539,821

(22) Filed: Aug. 12, 2009

(65) Prior Publication Data

US 2011/0037107 A1 Feb. 17, 2011

(51) Int. Cl.
*H01L 31/101* (2006.01)
(52) U.S. Cl. . 257/290; 257/291; 257/462; 257/E31.076; 257/E31.082; 257/E31.091
(58) Field of Classification Search .......... 257/290, 257/291, 462, E31.053, E31.069, E31.076, 257/E31.082, E31.091
See application file for complete search history.

(56) References Cited

U.S. PATENT DOCUMENTS

| 5,847,422 A | 12/1998 | Chi et al. |
| 2007/0114630 A1 | 5/2007 | Kishima |
| 2008/0165577 A1* | 7/2008 | Fazan et al. ............... 365/174 |

OTHER PUBLICATIONS

International Search Report and Written Opinion for PCT Application No. PCT/US2010/045320, Nov. 15, 2010.
Zhang et al., High Gain Gate/Body Tied NMOSFET Photo-Detector on SOI Substrate for Low Power Applications, Solid State Electronics, Elsevier Science Publishers, Barking, GB LNKD- DOI:10.1016/S0038-1101(99)00260-9, vol. 44, No. 3, Mar. 1, 2000.
J. Faist, Silicon Shines on, Nature, vol. 433, Feb. 17, 2005.
A. Polman, Teaching Silicon New Tricks, Nature, vol. 1, Sep. 2002.
G. Reed, The Optical Age of Silicon, Nature, vol. 427, Feb. 12, 2004.
H. Rong et al., An All-Silicon Raman Laser, Nature vol. 433, Jan. 20, 2005.
K. Shin et al., Parasitic Bipolar Junction Transistors in a Floating-Gate MOSFET for Fluorescence Detection, Electron Device Letters, IEEE, vol. 28, Issue 7, Jul. 2007 pp. 581-583.
W. Zhang et al., Performance of the Floating Gate/Body Tied NMOSFET Photodetector on SOI Substrate, IEEE Transactions on Electron Devices, vol. 47, Issue 7, Jul. 2000 pp. 1375-1384.
Wikipedia, Active pixel sensor, http://en.wikipedia.org/wiki/Active_pixel_sensor, printed Aug. 12, 2009.

* cited by examiner

*Primary Examiner* — Minh-Loan T Tran
(74) *Attorney, Agent, or Firm* — Hamilton & Terrile, LLP; Michael Rocco Cannatti

(57) ABSTRACT

A silicon photon detector device and methodology are provided for detecting incident photons in a partially depleted floating body SOI field-effect transistor (310) which traps charges created by visible and mid infrared light in a floating body region (304) when the silicon photon detector is configured in a detect mode, and then measures or reads the resulting enhanced drain current with a current detector in a read mode.

17 Claims, 4 Drawing Sheets

SILICON PHOTON DETECTOR

BACKGROUND OF THE INVENTION

1. Field of the Invention

The present invention relates in general to the field of semiconductor devices and semiconductor processing. In one aspect, the present invention relates to a method and apparatus for sensing or using light in an information processing system.

2. Description of the Related Art

Optical photonic circuits use light to provide high bandwidth, low power, and high speed information transfer, but in order to interface with existing integrated circuits for information processing, the light information must be converted into electrical information that is compatible with such integrated circuits. Prior attempts to develop photon detectors have encountered performance problems that result from the properties of the materials used to manufacture the photon detectors or from the design of the photon detector. For example, silicon-based light detectors are very inefficient at converting light with an energy below 1.1 eV (e.g., greater than approximately 1050 nm wavelength) to charge because of the indirect bandgap associated with silicon. In addition, conventional CCD, CMOS or BJT light detectors are relatively slow (because of the intrinsic RC times that are required to charge and discharge or reset), require too much space (because of the large active area required for such inefficient detectors), lack intrinsic gain, and cannot be used to detect mid-infrared light (because the detector efficiency approaches zero for light wavelengths above 1100 nm). However, because the transparency of bulk silicon allows optical signals to be routed through the silicon substrate, it is expected the first integration of optics into silicon chips will be around 1500 nm wavelength (e.g., approximately 0.8 eV). In addition, the telecommunications industry has perfected many aspects of high bandwidth communication with 1500 nm light, but has done so with detectors that use exotic semiconductor Group III-V materials (such as GaP, GaAs, or InP) which have not been readily and inexpensively integrated with existing CMOS fabrication processes.

Accordingly, a need exists for an improved integrated circuit photon detection device, methodology and system which addresses various problems in the art that have been discovered by the above-named inventors where various limitations and disadvantages of conventional solutions and technologies will become apparent to one of skill in the art after reviewing the remainder of the present application with reference to the drawings and detailed description which follow, though it should be understood that this description of the related art section is not intended to serve as an admission that the described subject matter is prior art.

SUMMARY OF THE INVENTION

Broadly speaking, a compact silicon-based optical detector is disclosed for detecting visible and mid-infrared light with a semiconductor-on-insulator (SOI) transistor having a floating body which effectively traps excess carriers from detected light, which enhances the drain current when the detector is read. In a photon detection mode, the gate, drain, and source terminals of the SOI detector transistor are held at a first fixed voltage (e.g., Vss) so that the floating SOI detector transistor body collects charge created by photons from incident light having a wavelength of up to at least 1500 nm. In a read mode, the excess charges in the body may be read at the source terminal by raising the drain and gate terminals to a second fixed reference voltage (Vref) which is selected to be at or near the unilluminated transistor threshold voltage (Vt) in order to increase device sensitivity while still providing good gain. The excess carriers in the body (holes for NMOS and electrons for PMOS) will remain in the body, but will electrostatically couple to the transistor channel, which works to reduce the threshold voltage and hence enhance drain current in read mode. In a reset mode, the body charge is removed by increasing diffusion in the body by setting the gate voltage to the first fixed voltage (e.g., Vss) and lowering the voltage at the drain terminal to a negative voltage. In this way, the optical detector converts photons to an electrical signal with gain. In selected embodiments, the disclosed optical detector can be fabricated with a standard CMOS process to be integrated as a detector for any silicon optical photonics application, including clock distribution and information transmission. In selected embodiments, the efficiency of the optical detection may be increased with architectures that stack a plurality of SOI optical detectors in parallel. In addition or in the alternative, the speed of the optical detection may be increased with architectures that place several transistors within the light beam path that are alternatively set in detect mode, read mode, and reset mode to increase detection speed.

In selected example embodiments, a floating body photon detector and methodology are disclosed. The disclosed floating body photon detector includes a semiconductor-on-insulator layer (e.g., a monocrystalline silicon layer formed over a buried insulator layer) that is formed over a substrate. Within the SOI layer is disposed a drain region, a source region and a floating body region that separates the source and drain regions. The floating body photon detector also includes a gate electrode disposed at least substantially overlying the floating body region of the SOI layer and insulated therefrom by a gate dielectric layer. With this structure, the floating body phototransistor has a first relatively higher threshold voltage when the floating body region is not illuminated with a first light source and a second relatively lower threshold voltage when the floating body region is illuminated with the first light source. In operation, the floating body region traps excess carriers from the first light source when a first relatively lower reference voltage is applied to the gate electrode and source and drain regions so that excess charges can be detected as enhanced drain current when a relatively higher reference voltage is applied to the gate electrode and drain region while the source region is held at the first relatively lower reference voltage. In selected embodiments, the source and drain regions are n-type source and drain regions, and the floating body region is a partially depleted p-type floating body region, resulting in the formation of an n-type or NMOS phototransistor. In other embodiments, the source and drain regions are p-type source and drain regions, and the floating body region is an n-type floating body region, resulting in the formation of a p-type or PMOS phototransistor. With appropriate doping and design, the floating body phototransistor has the second relatively lower threshold voltage when the floating body region is illuminated with the first light source having wavelengths up to at least 1500 nm.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

Figure 1:
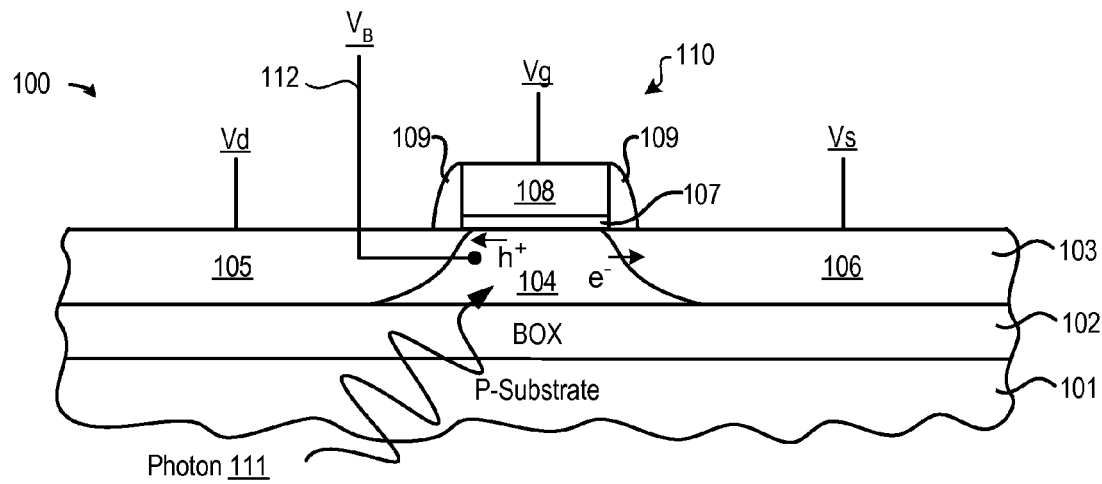
FIG. 1 is a partial cross-sectional view of a semiconductor wafer structure in which a field effect transistor is formed having a tied body structure.

A photon detector method and apparatus are provided for detecting light with a silicon-based integrated circuit detector by forming a floating body field-effect transistor on a semiconductor-on-insulator (SOI) substrate which traps excess charges created by visible and mid infrared light when the photon detector is configured in a detect mode, and then measures or reads the resulting enhanced drain current as a consequence of the presence of extra carriers in the body with a current detector in a read mode. By forming the photon detector with a partially depleted (PD) floating body SOI MOSFET transistor whose threshold voltage and intrinsic bipolar junction behavior are modified by the trapped photon-created charges in the floating body of the transistor, light may be detected with light sources having wavelengths up to at least 1500 nm, or even up to 2000 nm in selected embodiments. In the floating body configuration, any excess electrons in the floating body created by the incident light photons escape through the source or drain of the SOI MOSFET transistor, but excess holes in the floating body cannot escape because they are energetically constrained by the relative Fermi level from moving to the source or drain. In selected embodiments, photon absorption in the floating body region may be enhanced or controlled by creating mid-gap states during the SOI fabrication process and/or by using band-gap engineering to control the band-gap level. The trapped holes in the floating body may be measured as drain current to provide a current or voltage indication that light has been detected.

Various illustrative embodiments of the present invention will now be described in detail with reference to the accompanying figures. While various details are set forth in the following description, it will be appreciated that the present invention may be practiced without these specific details, and that numerous implementation-specific decisions may be made to the invention described herein to achieve the device designer's specific goals, such as compliance with process technology or design-related constraints, which will vary from one implementation to another. While such a development effort might be complex and time-consuming, it would nevertheless be a routine undertaking for those of ordinary skill in the art having the benefit of this disclosure. For example, selected aspects are shown in block diagram form, rather than in detail, in order to avoid limiting or obscuring the present invention. In addition, selected aspects are depicted with reference to simplified cross sectional drawings of a semiconductor device without including every device feature or geometry in order to avoid limiting or obscuring the present invention. Such descriptions and representations are used by those skilled in the art to describe and convey the substance of their work to others skilled in the art. In addition, although specific example materials are described herein, those skilled in the art will recognize that other materials with similar properties can be substituted without loss of function. It is also noted that, throughout this detailed description, certain materials will be formed and removed to fabricate the semiconductor structure. Where the specific procedures for forming or removing such materials are not detailed below, conventional techniques to one skilled in the art for growing, depositing, removing or otherwise forming such layers at appropriate thicknesses shall be intended. Such details are well known and not considered necessary to teach one skilled in the art of how to make or use the present invention.

Referring now to FIG. 1, there is shown a partial cross-sectional view of a semiconductor wafer structure 100 in which a field effect transistor 110 having a tied body structure is formed in a semiconductor-on-insulator (SOI) layer. As illustrated, the field effect transistor 110 is formed over an SOI substrate layer 103 and insulated from an underlying substrate layer 101 by a buried oxide layer 102. The field effect transistor 110 includes a gate electrode layer 108 formed on a gate dielectric layer 107 with one or more sidewall spacers 109, and also includes n-type drain and source regions 105, 106 which are selectively formed in the p-type SOI layer 103 to define a p-type channel region 104 below the gate electrode layer 108. When the completed field effect transistor device 110 is formed as an n-FET device 110 with the channel region 104 connected to a reference voltage (e.g., Vss) by the body tie connection 112, the n-FET device 110 is configured as a tied body device. In this tied body configuration, any excess electrons created when the n-FET device 110 is illuminated with light 111 (e.g., laser photons) escape through the source 106 or drain 105 of the n-FET device 110. In addition, the tied body configuration permits holes to escape through the body tie. However, when the body is floated, the holes remain behind to electrically charge the body.

Figure 2:
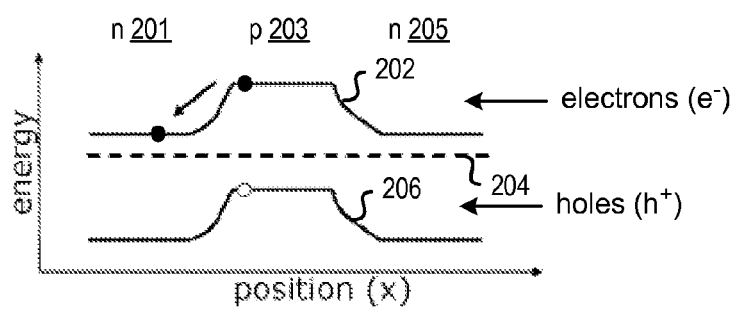
FIG. 2 is a simplified plot of the energy levels for holes and electrons in the substrate region of an NMOS field effect transistor as compared to the Fermi energy level of the silicon substrate.

To explain this behavior, reference is now made to FIG. 2 which shows a simplified plot of the energy levels for electrons 202 and holes 206 in the substrate region 104 of an n-type FET device 110 shown in FIG. 1 as compared to the Fermi energy level 204 of the SOI substrate layer 103. In FIG. 2, the n-region 201, p-region 203, and n-region 205 correspond respectively to the source 105, body 104, and drain 106 of the nFET device 110 from FIG. 1. As indicated by the arrow next to the electron symbol (e⁻), any excess electrons created in the substrate region 104 escape to the drain and source regions 105, 106 because they are able to move closer to the Fermi energy level 204. As for excess holes created in the body region 104, the relative position of the Fermi energy level 204 of the SOI substrate layer 103 does not permit the holes to escape to the drain and source regions 105, 106. The body tie 112 pulls the holes from the p-type body region 104 and to the reference or body voltage ($V_B$), as indicated by the arrow next to the hole symbol ($h^+$). However, the energy level plot of FIG. 2 also shows that, in a floating body configuration (where the reference or body voltage ($V_B$) is not connected to the p-type body region 203), the holes are trapped in the body region 203, thereby raising the potential of the body region 203.

Figure 3:
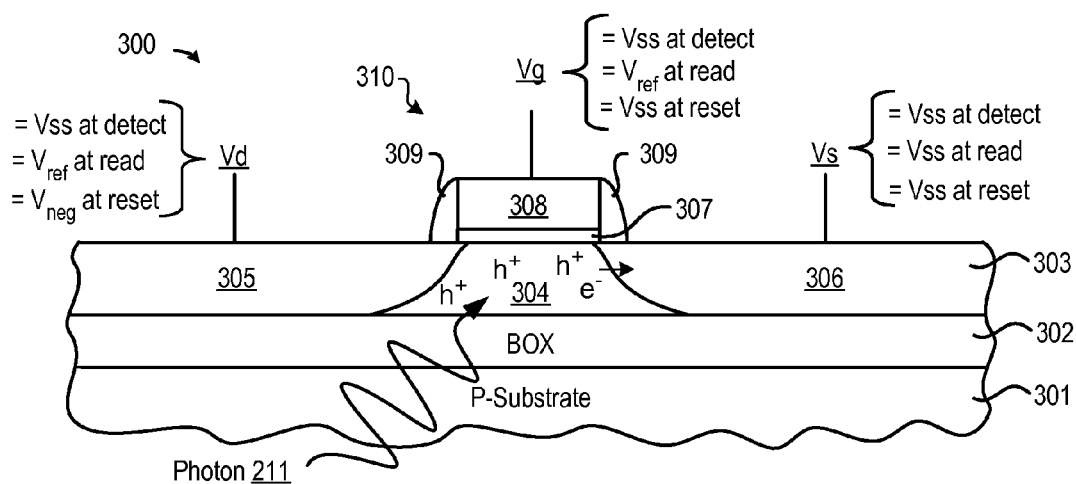
FIG. 3 is a partial cross-sectional view of a semiconductor wafer structure in which a field effect transistor is formed having a floating body structure which detects photons in accordance with selected embodiments of the present invention.

Referring now to FIG. 3, there is shown a partial cross-sectional view of a semiconductor wafer structure 300 in which a field effect transistor 310 is formed having a floating body structure which detects photons in accordance with selected embodiments of the present invention. As illustrated, the wafer structure 300 includes a first semiconductor layer 301 formed of a semiconductor material, such as silicon. Depending on the type of device being fabricated, the first semiconductor layer 301 may be implemented as a bulk silicon substrate, single crystalline silicon (doped or undoped), SOI substrate, or any semiconductor material or compound semiconductor material or any combination thereof, and may optionally be formed as the bulk handling wafer. As will be appreciated, the semiconductor layer 301 may be appropriately doped to provided n-type (electron) and p-type (hole) carriers, and in the illustrated example, may be doped as a p-type substrate layer 301.

The depicted wafer structure 300 also includes an insulator layer 302 formed on the first semiconductor layer 301 which will ultimately be used to form the buried oxide (BOX) layer for silicon-on-insulator devices. The insulator layer 302 may be formed with any desired insulator material, such as silicon dioxide, that is deposited, grown or implanted to form an isolation region that electrically isolates the first semiconductor layer 301 from the second semiconductor layer 303. In particular, the second semiconductor layer 303 may be formed on the insulator layer 302 as a thin semiconductor layer 303 (referred to as a semiconductor-on-insulator or SOI layer or SOI substrate layer) by depositing or growing a semiconductor material, such as silicon, to a predetermined thickness, depending on the circuit function being implemented. As depicted in FIG. 3, the SOI layer 303 may be initially formed by depositing a thin layer of silicon having a thickness of about 20-100 nm, and more specifically less than about 80 nm.

After or during formation of the SOI layer 303 on the insulator layer 302, a p-well region 304 in the SOI layer 303 may be doped with suitable p-type carriers. In an example implementation, the p-well region 304 is formed as a partially depleted p-type SOI substrate layer by providing a p-type dopant (e.g., boron) to a concentration of between approximately $5 \times 10^{17}$ to $5 \times 10^{18}$ cm$^{-3}$. As will be appreciated, the p-well region 304 may be formed by initially implanting the entirety of the SOI layer 303 with the desired concentration of impurities, in which case the source and drain regions are subsequently implanted to define the p-well region 304.

Over the p-well region, a field effect transistor device 310 is formed with a gate electrode structure that includes one or more gate insulator layers 307 disposed on the SOI layer 303 over at least the p-well region 304 to a predetermined thickness (e.g., 1-10 nm). The gate insulator 307 may be thermally grown dielectric layer (e.g., silicon dioxide), or deposited insulator layer (such as a silicon oxide, silicon nitride, a high dielectric constant insulator (e.g., HfSiO), or the like) that is deposited in a known manner by chemical vapor deposition (CVD), low pressure chemical vapor deposition (LPCVD), semi-atmospheric chemical vapor deposition (SACVD), or plasma enhanced chemical vapor deposition (PECVD). After forming the gate insulator layer 307, one or more gate electrode layers 308 are formed with a conductive material, such as polycrystalline silicon, that is deposited onto the gate insulator layer 307 as an undoped poly layer to a predetermined thickness (e.g., about 50-200 nm, and more specifically about 100 nm) by LPCVD by the hydrogen reduction of silane, and then subsequently doped with implanted impurities to make it conductive. In addition or in the alternative, other electrically conductive gate electrode-forming materials, such as metals and metal silicides, may be deposited. While the gate electrode layer(s) 308 may be formed to have the same materials and properties, it will be appreciated that different materials may be used to form the gate electrode layer(s) 308. For example, the gate electrode layer 108 may be formed with an n-type polysilicon layer or with a p-type polysilicon layer. The deposited gate electrode layer(s) may then be selectively etched to form the gate electrode structure 307, 308. As will be appreciated, the gate electrode structure 307, 308 may be formed using any desired pattern and etching processes, including application and patterning of photoresist to form an etch mask or resist pattern over the intended gate electrode 307, 308 during a gate etch process.

After forming the gate electrode structure 307, 308, one or more sidewall spacers 309 may be formed, respectively, on the sidewalls of the gate electrode 307, 308. Though not illustrated, it will be appreciated that the sidewall spacers 309 may be used, at least in part, to protect the p-well region 304 from implantation during formation of the n-type drain and source regions 305, 306 if at least part of the source/drain regions 305, 306 are formed after forming the gate electrode structure 307, 308. In any event, the sidewall spacers 309 may be formed with any suitable dielectric material that has an etch characteristic different from that of the gate electrode-forming material of gate electrode 307, 308 when exposed to the same etch chemistry. For example, sidewall spacers 309 may be formed by depositing a dielectric layer of silicon nitride, silicon oxide, or silicon oxynitride, and then anisotropically etching the deposited dielectric layer to leave only the sidewall spacers 309 on the sidewalls of the gate electrode 307, 308.

After forming the etched gate electrode structure 307, 308, a drain region 305 and a source region 306 are formed in the second semiconductor layer 303 so as to be separated from one another by the p-well region 304. As will be appreciated, the source and drain regions 305, 306 may be formed with an n-type dopant (e.g., arsenic or phosphorus) having a concentration of about $10^{21}$ to about $10^{22}$ cm$^{-3}$, and can be fabricated with any desired selective doping, diffusion or implantation process, such as by implanting n-type impurities around the etched gate electrode structure 307, 308 (alone or in combination with the sidewall spacers 309) which form an implant mask to protect the p-well region 304 from the implantation.

Though not illustrated, it will be appreciated that additional processing steps will be used to complete the fabrication of the field effect transistor device 310 into a functioning device that may be activated and used in an active circuit. As examples, one or more sacrificial oxide formation, stripping, isolation region formation, well region formation, extension implant, halo implant, spacer formation, source/drain implant, heat drive or anneal steps, and polishing steps may be performed, along with conventional backend processing (not depicted), typically including formation of multiple levels of interconnect that are used to connect the transistors in a desired manner to achieve the desired functionality. Thus, the specific sequence of steps used to complete the fabrication of the semiconductor structures may vary, depending on the process and/or design requirements.

Once the processing of the wafer structure is completed and the wafer structure is divided into individual die, external leads or pins or conductors are formed which are used to supply signals and reference voltages to the field effect transistor device 310 via one or more bonding pads and voltage or signal terminal pads. The connection of the field effect transistor device 310 to these external voltage signals is illustrated in FIG. 3 with the voltages Vd, Vg, and Vs being respectively applied to the drain terminal 305, gate terminal 308, and source terminal 306 of the field effect transistor device 310. But instead of tying the channel region 304 to a reference voltage, the channel region 304 is left floating so that the FET device 310 is configured as a floating body device. In this floating body configuration, any excess electrons created when the NFET device 310 is illuminated with light 311 (e.g., laser photons) are able to escape through the drain region 305 or source region 306 because they are able to move closer to the Fermi energy level 204 (as shown in FIG. 2), as indicated by the arrow next to the electron symbol (e−). However, any excess holes created in the body region 304 by the incident light photons 311 are trapped because the relative position of the Fermi energy level 204 of the SOI substrate layer 303 does not permit the holes to escape to the drain and source regions 305, 306.

In selected embodiments, this floating body effect may be used to form an integrated circuit silicon photon detector from the SOI FET device 310 which is compact and inexpensive to manufacture. For example, the SOI FET device 310 may be formed to have a 45 nm active region which is much smaller than any known CCD array optical detector, but which is able to detect laser light having wavelengths up to at least 1500 nm. When the photon detector is implemented as a standard floated body partially depleted (PD) SOI MOSFET device 310, any illumination of MOSFET device 310 from the backside with laser photon light 311 creates charge-neutral electron-hole pairs in the channel region 304. While the electrons are able to escape, the p-n junction physics effectively trap the holes in the body region 304, thereby modifying the threshold voltage (Vt) and intrinsic bipolar junction behavior in the channel region body 304 of the MOSFET device 310. As will be appreciated, photon absorption may be enhanced or otherwise controlled in the channel region 304 by virtue of mid-gap states created in the SOI fabrication process, by band-gap engineering, and by adjusting the length and/or doping of the floating body region 304. And when the MOSFET device 310 is formed to have small active regions (e.g., 45 nm), the resulting small body capacitance results in the excess charges created by photon absorption having greater influence on the transistor behavior with respect to larger transistor geometries.

The SOI FET optical detector 310 should have at least three modes of operation—detect, read, and reset—which are established by applying the appropriate control voltages Vd, Vg, and Vs to the drain terminal 305, gate terminal 308, and source terminal 306, respectively. During the photon detect mode, the drain 305, gate 308, and source 306 are lowered or held at Vss (e.g., 0V), allowing the transistor body 304 to collect charge which is created in the presence of photons from the incident light 311. In selected embodiments, the transistor body 304 will collect positive charge if the transistor body 304 is illuminated with light of wavelength less than or equal 1550 nm. During a read mode, the collected charge in the transistor body 304 may be read by raising the voltages Vg, Vd at the gate 308 and drain 305 to or near a predetermined reference voltage (Vref) to increase or maximize sensitivity of the transistor 310 (since relative change is maximized near the threshold voltage) while maintaining gain that is similar to the gain from a BJT phototransistor. The two consequences to the excess body charge are a reduction in the threshold voltage (a forward body bias from the illuminated transistor has a lower threshold voltage than the unilluminated transistor) and a turning on of the intrinsic BJT, both of which enhance the drain current during read mode. In this way, the floated body effect in the transistor 310 will have a natural gain similar to a bipolar junction transistor (BJT) phototransistor. The collected charge is then read as drain current (Id) at a current detector (not shown) that is electrically coupled to the source region 308. In a reset mode, any collected charge in the transistor body 304 is removed by lowering or setting the gate 308 at Vss (e.g., 0V) and lowering the drain 305 to a negative voltage, Vneg, thereby increasing diffusion in the body.

Figure 4A:
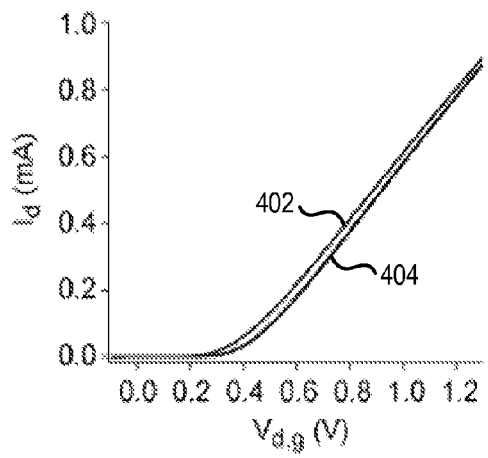
FIG. 4(a) is a plot of the drain current measured as a function of the gate and drain voltage for an SOI optical detector transistor that is illuminated with a first light source.
Figure 4B:
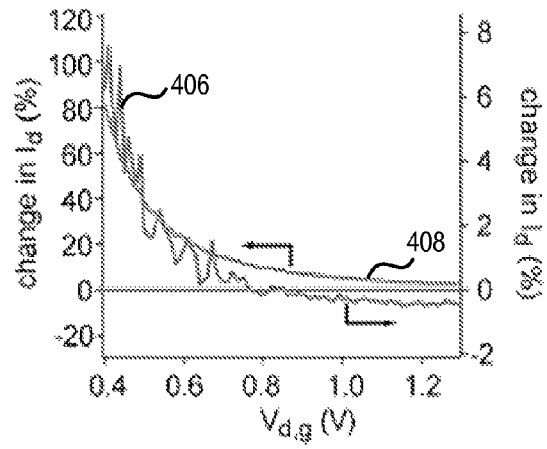
FIG. 4(b) is a plot of the relative change in drain current measured as a function of the gate and drain voltage for an SOI optical detector transistor that is illuminated with first and second light sources.

To demonstrate that light can be used to enhance drain current from the floating body SOI FET optical detector 310, reference is now made to FIGS. 4(a)-(d) which provide various electrical property measurements of a floating body n-type SOI FET optical detector device in the presence and absence of one or more light sources. In particular, FIG. 4(a) demonstrates the clear enhancement of drain current (Id) for an 80 nm floated body PD-SOI transistor with a 1064 nm laser illumination, where the drain current is measured for a sweep of both Vd and Vg together (Vg=Vd=Vd,g). As depicted in FIG. 4(a), the drain current (Id) increases when the n-FET transistor is illuminated with a 1064 nm laser since the "laser on" drain current measurement 402 is higher than the "laser off" drain current measurement 404. Because the drain current (Id) varies over several orders of magnitude over the range of Vd,g, it is more useful to plot relative changes in the drain current (Id), defined as:

$$\text{Relative change (\%)} = (I_d(P_\lambda, V_{d,g}) - I_d(P_0, V_{d,g}))/(I_d(P_0, V_{d,g})), \quad (1)$$

where $I_d(P_0, V_{d,g})$ is always defined at $P_0=0$ mW (laser off). In addition, the laser power $P_\lambda$ at 1320 nm ($P_{1320}=6$ mW) or 1064 nm ($P_{1064}=1.6$ mW) was set, and Vd,g was then varied. When the relative change is measured, positive relative change corresponds to enhanced drain current (Id) with respect to the unilluminated transistor, while negative relative change corresponds to suppressed drain current (Id) with respect to the unilluminated transistor. In FIG. 4(b), the relative change in drain current (Id) is shown for both the 1320 nm laser illumination (with data line 406) and the 1064 nm laser illumination (with data line 408). As shown in FIG. 4(b), the drain current (Id) from the SOI FET optical detector device is always enhanced by the 1064 nm laser (since the data line 408 is always positive), but the 1320 nm laser has a crossover from enhanced drain current Id (at low Vd,g) to suppressed drain current Id (at high Vd,g). It is important to recognize that the enhanced drain current (Id) at low Vd,g is very similar for both the 1320 nm laser (below bandgap) as the 1064 nm laser (above bandgap).

Two effects are believed to be responsible for the crossover voltage at approximately 0.8V in FIG. 4(b). First, the 1320 nm laser heats the transistor substrate, reducing the transistor mobility μ (which reduces the saturation drain current (Id,sat)) while simultaneously reducing the threshold voltage (Vt) (which increases the saturation drain current (Id,sat)). This results from the fact that both the mobility and threshold voltage are reduced as the device temperature increases. Additionally, the threshold voltage (Vt) is further reduced by the laser-induced body potential ($V_B$). A crossover voltage then occurs as Vd,g increases because the reduction in mobility μ becomes more important than the reduction in the threshold voltage (Vt).

Figure 4C:
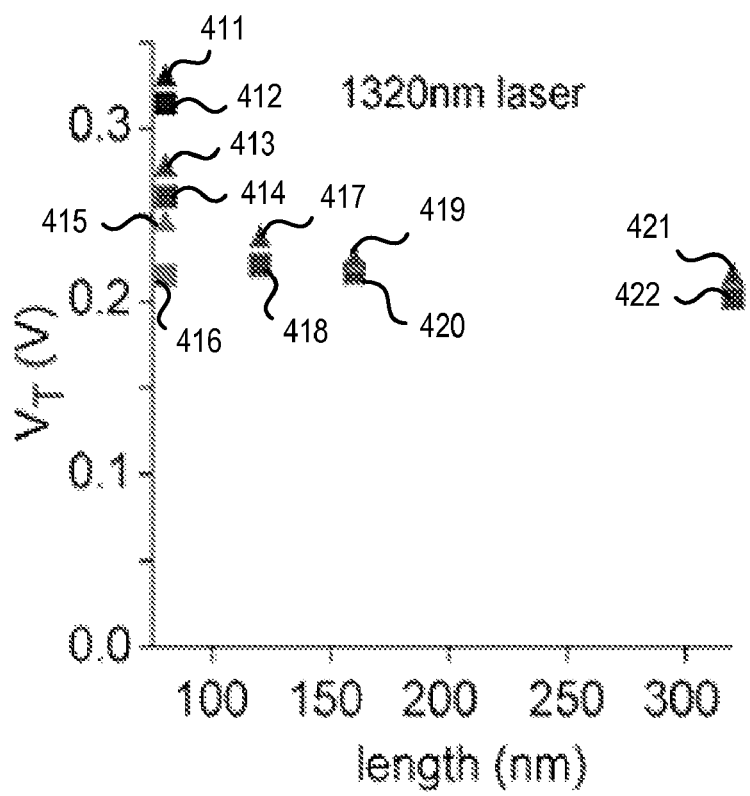
FIG. 4(c) is a plot of the threshold voltage as a function of the SOI optical detector transistor length and doping to show the effects of illumination with a 1320 nm laser light source.

In FIGS. 4(c) and (d), the threshold voltage (Vt) of a floating body SOI NMOS transistor is plotted as a function of transistor length with either 1320 nm or 1064 nm laser illumination or no laser illumination. In particular, the 1320 nm laser illumination data in FIG. 4(c) shows that the threshold voltage 412 (for an illuminated transistor having an 80 nm drawn length and a high threshold voltage (HVT) doping profile) is lower than the threshold voltage 411 for the HVT transistor that is not illuminated. Likewise, the threshold voltage 414 (for a illuminated transistor having an 80 nm drawn length and a medium threshold voltage (MVT) doping profile) is lower than the threshold voltage 413 for the MVT transistor that is not illuminated, and the threshold voltage 416 for an illuminated transistor having an 80 nm drawn length and a low threshold voltage (LVT) doping profile is lower than the threshold voltage 415 for the LVT transistor that is not illuminated. The relative threshold voltage measurements are also borne out for larger device lengths. In particular, FIG. 4(c) shows that the threshold voltage 417 for an unilluminated transistor having a 120 nm drawn length and a medium threshold voltage (MVT) doping profile is higher than the threshold voltage 418 for the 120 nm MVT transistor that is illuminated. Likewise, the threshold voltage 419 for an unilluminated 160 nm transistor having an MVT doping profile is higher than the threshold voltage 420 for the 160 nm MVT transistor that is illuminated, and the threshold voltage 421 for an unilluminated 320 nm transistor having an MVT doping profile is higher than the threshold voltage 422 for the 320 nm MVT transistor that is illuminated. As this data shows, the threshold voltage (Vt) reduction occurs for various length and doping profiles with the 1320 nm laser illumination of transistors as compared with unilluminated transistors. In particular, the threshold voltage shift between 413, 414 is approximately 6% for MVT 80 nm NMOS transistors.

Figure 4D:
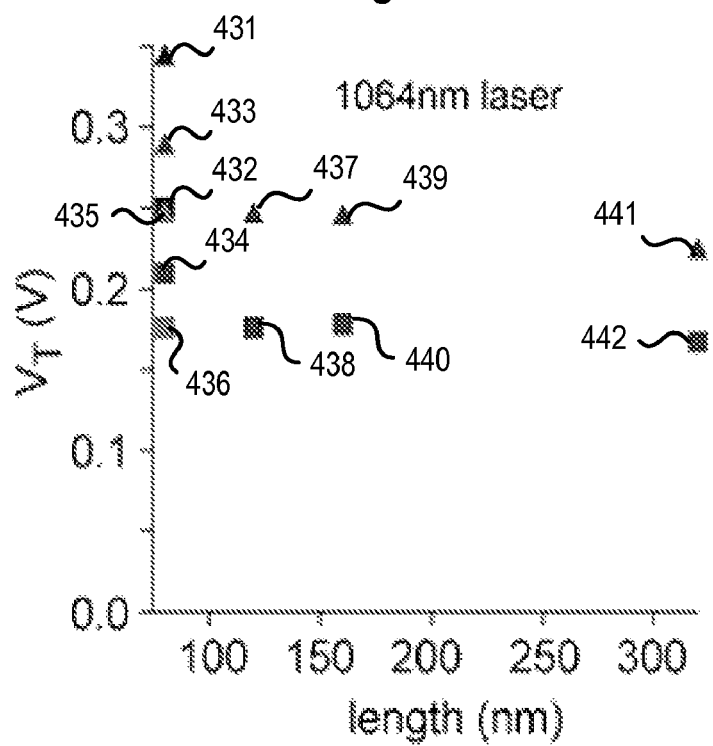
FIG. 4(d) is a plot of the threshold voltage as a function of the SOI optical detector transistor length and doping to show the effects of illumination with a 1064 nm laser light source.

For comparison purposes, FIG. 4(d) shows the 1064 nm laser illumination data, including the threshold voltage 431 for an illuminated transistor having an 80 nm drawn length and a high threshold voltage (HVT) doping profile which is higher than the threshold voltage 432 for the HVT transistor that is not illuminated. Likewise, the threshold voltage 433 for an illuminated transistor having a 80 nm drawn length and a medium threshold voltage (MVT) doping profile is higher than the threshold voltage 434 for the MVT transistor that is not illuminated, and the threshold voltage 435 for an illuminated transistor having a 80 nm drawn length and a low threshold voltage (LVT) doping profile is higher than the threshold voltage 436 for the LVT transistor that is not illuminated. The relative threshold voltage measurements are also borne out for larger device lengths. In particular, FIG. 4(d) shows that the threshold voltage 437 for an illuminated transistor having a 120 nm drawn length and a medium threshold voltage (MVT) doping profile being higher than the threshold voltage 438 for the 120 nm MVT transistor that is not illuminated. Likewise, the threshold voltage 439 for an illuminated 160 nm transistor having an MVT doping profile is higher than the threshold voltage 440 for the 160 nm MVT transistor that is not illuminated, and the threshold voltage 441 for an illuminated 320 nm transistor having an MVT doping profile is higher than the threshold voltage 442 for the 320 nm MVT transistor that is not illuminated. Again, the threshold voltage (Vt) reduction occurs for various length and doping profiles with the 1064 nm laser illumination of transistors as compared with unilluminated transistors. In particular, the threshold voltage shift between 433, 434 is approximately 30% for MVT 80 nm NMOS transistors.

As shown in FIGS. 4(a)-(d), the floating body potential of the transistor channel region in the SOI NMOS transistor plays an extremely strong role in transport through the transistor, resulting in enhanced drain current (Id) when light is detected, especially when Vd,g is at low bias levels. The depicted data measurements show that the "laser on" threshold voltage (Vt) is always reduced for both the 1064 nm and 1320 nm lasers as compared to the "laser off" threshold voltage, but the threshold voltage reduction is shifted more severely for the 1320 nm laser as the transistor length reduces.

Given this function of the floating body SOI NMOS transistor device as a light detector, the doping profile of the p-well region 304 may be selected to provide the required amount of threshold voltage shift between "laser on" and "laser off" conditions. To this end, when there is a crossover effect for certain light sources (e.g., 1320 nm lasers), the doping of the p-well region 304 can be used to determine or control the crossover voltage for light-induced drain current enhancement. Thus, the p-well or channel region in an n-type SOI FET optical detector device may be formed with the appropriate well doping profile (e.g., low threshold voltage (LVT) doping, medium threshold voltage (MVT) doping, or high threshold voltage (HVT) doping) in order to ensure that there is drain current enhancement in response to the desired light wavelength. Thus, the doping concentration of the p-well region 304 may be selected to provide a high crossover voltage for the desired light source, where the doping effects the generation-recombination rates in the body region 304. In addition, there is no crossover voltage for smaller, 45 nm transistors, since both 1320 nm and 1500 nm illumination sources enhance the drain current at all read voltages.

Figure 5:
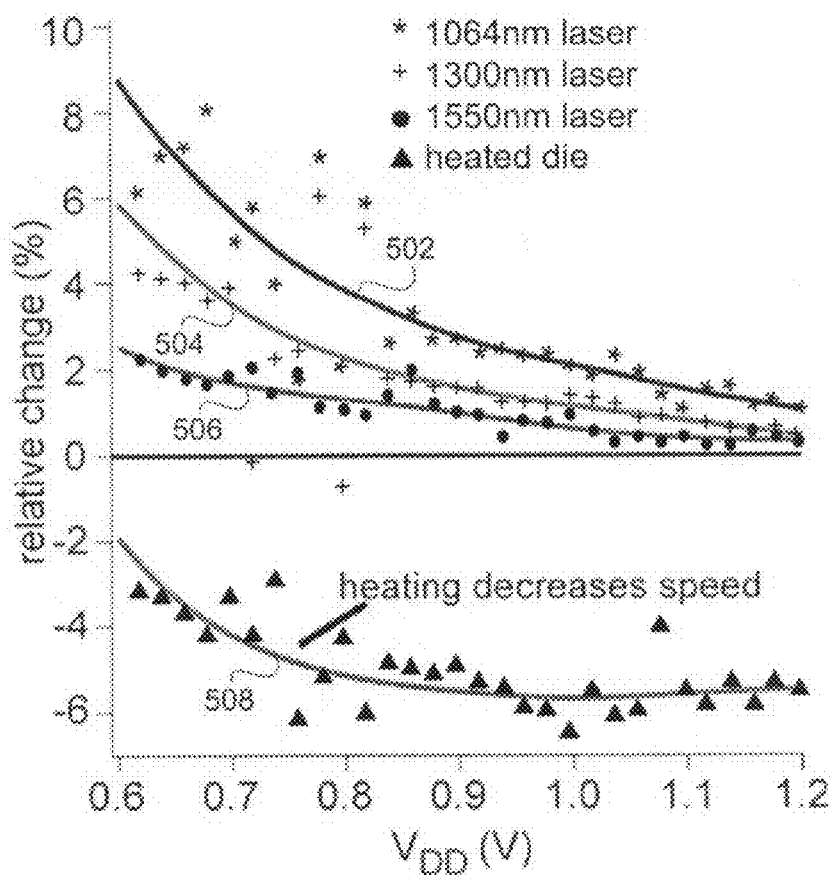
FIG. 5 is a plot of the relative change in drain current measured as a function of the reference voltage Vdd for an SOI optical detector transistor that is illuminated with a plurality of different laser light sources.

In selected embodiments, the optical detector is implemented as a 45 nm floating body n-FET SOI NMOS transistor device that provides an optical detection function at normal communication wavelengths, including a detection response for light sources all the way to the mid-infrared light range (e.g., up to at least 1500 nm). This is illustrated in FIG. 5 with the data plots of the relative change in drain current measured as a function of the reference voltage Vdd for an SOI optical detector transistor that is illuminated with a plurality of different laser light sources. As shown at data line 502, a 1064 nm laser light source induces a floating body charge effect that results in a positive relative change (and enhanced drain current) across the indicated range of reference voltages. Likewise, data line 504 shows that a 1300 nm laser light source induces a positive relative change (and enhanced drain current) across the indicated range of reference voltages, and data line 506 shows that a 1550 nm laser light source induces a positive relative change (and enhanced drain current) across the indicated range of reference voltages. This data shows that, even with light sources at wavelengths that are below the silicon bandgap (e.g., 1300 nm and 1550 nm light sources), the optical detector has a positive relative change. And as shown with data line 508, the body charging effects 502, 504, 506 are much greater than the heating effect of the laser on electrical transport, which is greatly preferred because excess charge can be removed much more quickly from the channel than excess heat for fast operation.

Figure 6:
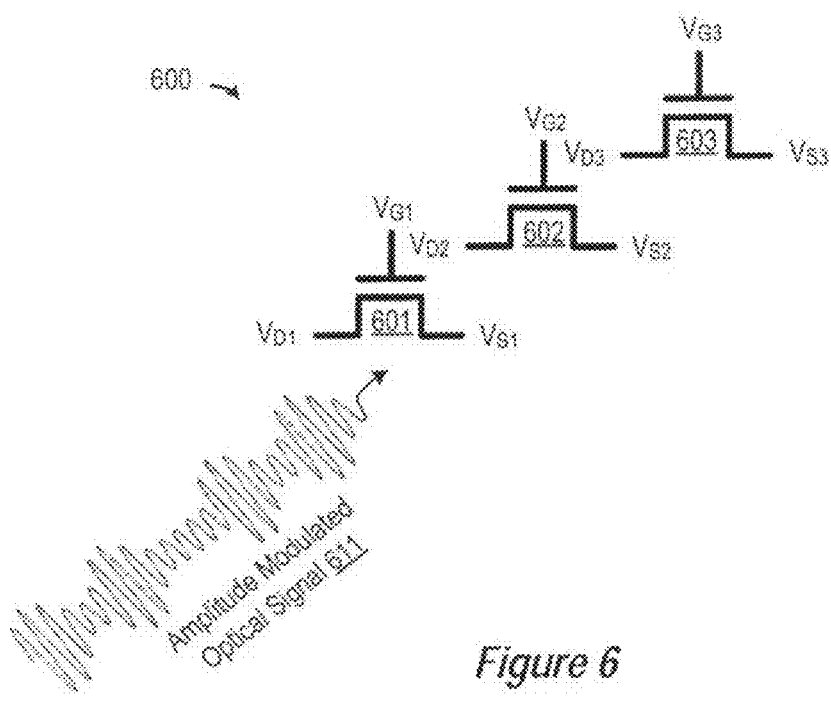
FIG. 6 is a simplified schematic circuit diagram of a silicon photon detector architecture in which a plurality of SOI optical detectors are stacked in parallel to enhance the photon detection efficiency and/or speed.

To increase efficiency and/or speed of light detection, selected embodiments employ architectures which use the small geometry of the optical detector to enhance and speed up collection of light photons. For example, FIG. 6 is a simplified schematic circuit diagram of a silicon photon detector architecture 600 in which a plurality of SOI optical detectors 601-603 are stacked in parallel to enhance the photon detection efficiency. By combining the detection capabilities of a plurality of floating body PD SOI devices, any incident light 611 can be detected by all three devices which, due to their small size, do not require significant circuit area.

In addition or in the alternative, by constructing and arranging the plurality of floating body PD SOI devices 601-603 in a geometry that is aligned within the light beam path 611, each device may be alternately set in detect mode, read mode, and reset mode to increase timing or speed of detection. For example, if an amplitude modulated photon signal 611 illuminates the PD SOI devices 601-603 along a row, the relative transparency and size of the devices 601-603 means that the signal beam 611 reaches each of the PD SOI devices 601-603. At a given time, appropriate control voltages are applied to each of the devices 601-602 so that the first PD SOI device 601 is held in detect mode, while second and third PD SOI devices 602, 603 are held in a reset mode. Once the signal 611 has propagated, the first PD SOI device 601 is then set to "read mode" and the second PD SOI device 602 is set to "detect mode" for a second signal, while the third PD SOI device 603 is held in "reset mode." Subsequently, the third PD SOI device 603 is then set to "detect mode" wile the first PD SOI device 601 is reset. As will be appreciated, additional or fewer PD SOI devices could be used in this manner to optimize read and detect times for a given optical signal.

By now it should be appreciated that there has been disclosed herein a method for fabricating a floating body silicon optical detector. In the disclosed methodology, a semiconductor substrate is provided, an insulator layer is formed overlying the semiconductor substrate, and a monocrystalline silicon layer is formed overlying the insulator layer. In addition, at least a first floating body phototransistor is formed by forming a floating body region in the monocrystalline silicon layer, forming a first gate electrode and gate dielectric overlying the floating body region, and forming first source and drain regions in the monocrystalline silicon layer on opposite sides of the first gate electrode and floating body region. In selected embodiments, the source and drain regions are formed as p-type source and drain regions, and the floating body region is formed as an n-type floating body region in the monocrystalline silicon layer. In other embodiments, the source and drain regions are formed as n-type source and drain regions, and the floating body region is formed as a partially depleted p-type floating body region in the monocrystalline silicon layer. With this structure, the floating body region is configured to trap excess holes from a light source having wavelengths up to the mid-infrared wavelengths when a first relatively lower reference voltage is applied to the first gate electrode and first source and drain regions. In this floating body configuration, the optical detector can detect excess holes as enhanced drain current when a relatively higher reference voltage is applied to the first gate electrode and first drain region while the first source region is held at the first relatively lower reference voltage. In selected embodiments, a plurality of floating body phototransistors are formed, where each floating body phototransistor includes a floating body region in the monocrystalline silicon layer, a first gate electrode and gate dielectric overlying the floating body region, and source and drain regions in the monocrystalline silicon layer on opposite sides of the gate electrode and floating body region, where each floating body region is configured to trap excess holes from a light source having wavelengths up to the mid-infrared wavelengths when a first relatively lower reference voltage is applied to the respective gate electrodes and source and drain regions, and is configured to release excess holes as drain current when a relatively higher threshold voltage is applied to the respective gate electrodes and drain regions while each source region is held at the first relatively lower reference voltage.

The particular embodiments disclosed above are illustrative only and should not be taken as limitations upon the present invention, as the invention may be modified and practiced in different but equivalent manners apparent to those skilled in the art having the benefit of the teachings herein. For example, while the floating body PD SOI optical detection devices have been described herein with reference to selected NMOS transistor examples, it will be appreciated that selected embodiments may employ PMOS transistors in the floating body PD SOI optical detection devices, and still obtain significant threshold voltage reduction due to the light-induced floating body effect across a wide range of light wavelenghths. In addition, photon detectors may be implemented with partially or fully depleted SOI FET devices having a threshold voltage which is modified during a detect mode by excess carriers created by photons from incident light in the floating body region of the transistor to produce a measurable enhanced current during a read mode. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

What is claimed is:

1. A floating body photon detector, comprising:
   a semiconductor-on-insulator (SOI) layer formed over a substrate;
   a drain region disposed within the SOI layer;
   a floating body region disposed within the SOI layer in series with the drain region;
   a source region disposed within the SOI layer in series with the floating body region; and
   a gate electrode disposed at least substantially overlying the floating body region of the SOI layer and insulated therefrom by a gate dielectric layer, thereby forming a floating body phototransistor having a first relatively higher threshold voltage when the floating body region is not illuminated with a first light source having wavelengths up to at least 1500 nm and a second relatively lower threshold voltage when the floating body region is illuminated with the first light source having wavelengths up to at least 1500 nm.

2. The floating body photon detector of claim 1, where the SOI layer comprises a monocrystalline silicon layer formed over a buried insulator layer.

3. The floating body photon detector of claim 1, where the source and drain regions respectively comprise n-type source and drain regions, and where the floating body region comprises a p-type floating body region.

4. The floating body photon detector of claim 3, where the p-type floating body region comprises a partially depleted p-type floating body region.

5. The floating body photon detector of claim 1, where the source and drain regions respectively comprise p-type source and drain regions, and where the floating body region comprises an n-type floating body region.

6. The floating body photon detector of claim 5, where the n-type floating body region comprises a partially depleted n-type floating body region.

7. The floating body photon detector of claim 1, where the floating body region traps excess charges created by the first light source when a first relatively lower reference voltage is applied to the gate electrode and source and drain regions so that excess charges can be detected as enhanced drain current when a relatively higher reference voltage is applied to the gate electrode and drain region while the source region is held at the first relatively lower reference voltage.

8. A method for fabricating a floating body silicon optical detector, comprising:
providing a semiconductor substrate;
forming an insulator layer overlying the semiconductor substrate;
forming monocrystalline silicon layer overlying the insulator layer; and
forming at least a first floating body phototransistor by:
forming a first floating body region in the monocrystalline silicon layer;
forming a first gate electrode and gate dielectric overlying the first floating body region;
forming first source and drain regions in the monocrystalline silicon layer on opposite sides of the first gate electrode and first floating body region, where the first floating body region is configured to trap excess holes from a light source having wavelengths up to at least 1500 nm when a first relatively lower reference voltage is applied to the first gate electrode and first source and drain regions such that the floating body silicon optical detector is configured to detect excess holes as enhanced drain current when a relatively higher reference voltage is applied to the first gate electrode and first drain region while the first source region is held at the first relatively lower reference voltage.

9. The method of claim 8, where forming the first floating body region comprises forming a first floating body partially depleted p-type body region in the monocrystalline silicon layer.

10. The method of claim 9, where forming the first source and drain regions comprises forming first n-type source and drain regions.

11. The method of claim 8, where forming the first source and drain regions comprises forming first p-type source and drain regions and where forming the first floating body region comprises forming a first n-type floating body region in the monocrystalline silicon layer.

12. The method of claim 8, where forming at least the first floating body phototransistor comprises forming a plurality of floating body phototransistors, each of which comprises a floating body region in the monocrystalline silicon layer, a first gate electrode and gate dielectric overlying the floating body region, and source and drain regions in the monocrystalline silicon layer on opposite sides of the gate electrode and floating body region, where each floating body region is configured to trap excess holes from a light source having wavelengths up to at least 1500 nm when a first relatively lower reference voltage is applied to the respective gate electrodes and source and drain regions such that each floating body transistor is configured to detect excess holes as enhanced drain current when a relatively higher reference voltage is applied to the respective gate electrodes and drain regions while each source region is held at the first relatively lower reference voltage.

13. An integrated circuit infrared light detector, comprising:
a floating body silicon-on-insulator field effect transistor having a threshold voltage which is modified during a detect mode by excess carriers created by photons from incident light in a floating body region of the transistor to produce a measurable enhanced current during a read mode, where the floating body silicon-on-insulator field effect transistor produces measurable enhanced current created by photons from incident infrared light having a wavelength up to at least 1500 nm.

14. The integrated circuit infrared light detector of claim 13, where the floating body silicon-on-insulator field effect transistor comprises:
a semiconductor-on-insulator (SOI) layer in which is formed a drain region, floating body region, and source region; and
a gate electrode disposed at least substantially overlying the floating body region of the SOI layer and insulated therefrom by a gate dielectric layer, thereby forming a floating body phototransistor having a first relatively higher threshold voltage when the floating body region is not illuminated with a first light source and a second relatively lower threshold voltage when the floating body region is illuminated with the first light source.

15. The integrated circuit infrared light detector of claim 14, where the floating body silicon-on-insulator field effect transistor is placed in the detect mode by holding the gate electrode and source and drain regions at a first fixed voltage so that the floating body region collects carriers created by photons from incident light.

16. The integrated circuit infrared light detector of claim 14, where the floating body silicon-on-insulator field effect transistor is placed in the read mode by raising the gate electrode and drain region to a second fixed voltage so that excess carriers in the floating body region reduce the threshold voltage and thereby produce an enhanced drain current.

17. The integrated circuit infrared light detector of claim 14, where the floating body silicon-on-insulator field effect transistor comprises n-type source and drain regions and a partially depleted p-type floating body region formed in a semiconductor-on-insulator (SOI) layer.

* * * * *